United States Patent [19]
Enderby

[11] Patent Number: 4,580,289
[45] Date of Patent: Apr. 1, 1986

[54] FULLY INTEGRATABLE SUPERHETERODYNE RADIO RECEIVER UTILIZING TUNABLE FILTERS

[75] Inventor: Ralph T. Enderby, Sunrise, Fla.

[73] Assignee: Motorola, Inc., Schaumburg, Ill.

[21] Appl. No.: 625,350

[22] Filed: Jun. 21, 1984

Related U.S. Application Data

[63] Continuation of Ser. No. 335,988, Dec. 30, 1981, abandoned.

[51] Int. Cl.⁴ ............................................... H04B 1/26
[52] U.S. Cl. .................................... 455/314; 455/197; 455/266; 455/340; 455/260; 331/31
[58] Field of Search ................. 455/22, 189, 197, 207, 455/209, 183, 260, 265, 266, 340, 314–316; 331/31, 38

[56] References Cited

U.S. PATENT DOCUMENTS

| | | |
|---|---|---|
| 3,281,698 | 10/1966 | Rose, Jr. et al. ................... 455/266 |
| 3,327,222 | 6/1967 | King, Jr. ............................ 455/315 |
| 3,414,821 | 12/1968 | Bickers et al. ..................... 455/315 |
| 3,541,451 | 11/1970 | Lind .................................. 455/266 |
| 3,614,627 | 10/1971 | Runyan .............................. 455/316 |
| 3,878,476 | 4/1975 | Honore et al. ..................... 455/314 |
| 4,045,740 | 8/1977 | Baker ................................. 455/266 |
| 4,063,173 | 12/1977 | Nelson et al. ..................... 455/22 |
| 4,160,212 | 7/1979 | Barquist, Jr. et al. ............. 455/314 |

OTHER PUBLICATIONS

"Fully-Integrated Analog Filters" by Sedra, IEEE International Solid-State Circuits Conference, 1978.

Primary Examiner—Jin F. Ng
Attorney, Agent, or Firm—Martin J. McKinley; Joseph T. Downey; Edward M. Roney

[57] ABSTRACT

A radio receiver from antenna to detector designed to be realized substantially on an integrated-circuit chip comprises a single tunable oscillator and a plurality of mixers. An input signal from an antenna is connected as an input to a first mixer and mixed with a signal derived from the oscillator. The signal may be taken directly, may be multiplied to a desired level or may be divided to a desired level. A particular output from the first mixer is selected by a first tunable filter. The output of the first tunable filter is taken as an input to a second mixer where it is mixed with a second signal derived from the oscillator. The process of mixing and application of the mixed signal to a tunable filter to select a desired frequency is continued as needed until the signal is reduced to a desired intermediate frequency range where it is amplified as needed to a level sufficient to drive a discriminator. Successive mixers receive, as inputs, signals that are derived by multiplication from the oscillator and that are in ratios to each other of integers of the order of two to eight. The center frequency of each of the tunable filters changes as different crystals or synthesized base frequencies are selected. This variation continues through the last intermediate frequency.

24 Claims, 5 Drawing Figures

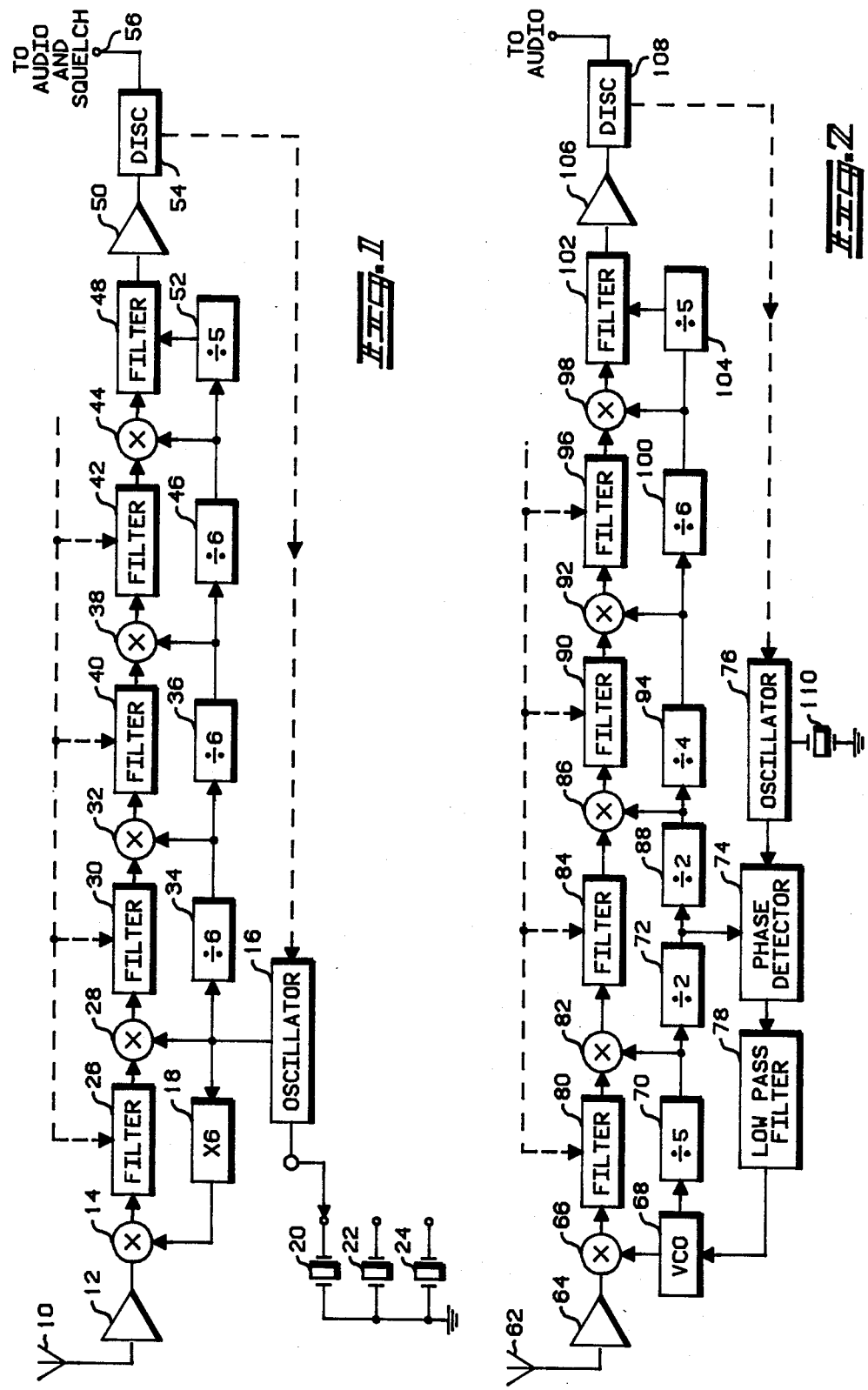

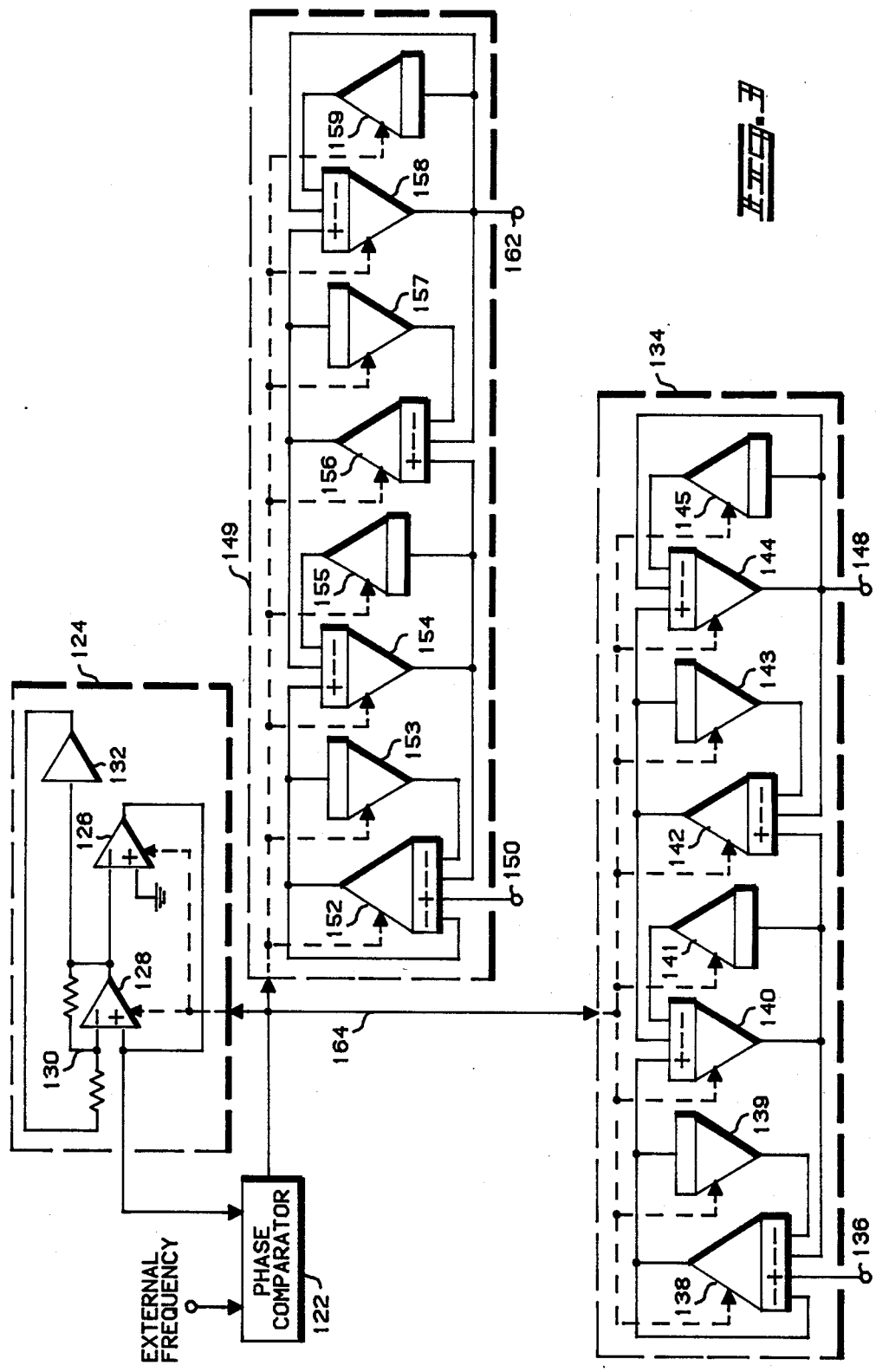

FULLY INTEGRATABLE SUPERHETERODYNE RADIO RECEIVER UTILIZING TUNABLE FILTERS

This is a continuation of application Ser. No. 335,988 filed Dec. 30, 1981, now abandoned.

BACKGROUND OF THE INVENTION

This invention relates to radio receivers. In particular, it relates to a receiver that is adapted for realization in an integrated circuit.

A feature of radio receivers since the general adoption of the superheterodyne receiver has been the use of a local oscillator that is tunable. The local oscillator produces a signal that is mixed with an incoming signal to produce an IF signal at a frequency that is fixed. This is sometimes combined with double or triple conversion so that the receiver has two or three intermediate frequencies. These generally have been fixed, and an advantage of the superheterodyne receiver has been the fact that the tuning is essentially limited to the high-frequency end. This includes a local oscillator and any stages of amplification up to a first mixer. After the first mixer, which may be the only mixer, the principal elements of selectivity are the fixed-tuned IF stages. It has been easier to achieve a relatively high level of selectivity in such stages because it is not necessary to tune them.

The features that have been described as advantages of the superheterodyne receiver can become disadvantages when it is desired to make a radio receiver in the form of an integrated circuit. The selectivity of the IF stages in a typical superheterodyne receiver is achieved by the use of tuned circuits that typically involve parallel LC circuits. Electrical isolation to prevent oscillation is typically achieved in such circuits by placing the tuned circuits in metal shields. The result is to produce a number of relatively high-volume elements that use valuable space and are not well adapted to be placed in integrated circuits.

A further feature of integrated circuits is the relative ease with which additional active elements are included in the design of such a circuit. In general, it is easier to add several transistors to the design than it is to incorporate a single inductor or capacitor. The availability of such transistors in an integrated circuit makes it easier to use active filters which both minimize or eliminate the use of inductors and capacitors and also make it easier to vary certain of the parameters of the filters.

SUMMARY OF THE INVENTION

It is an object of the present invention to provide a radio receiver that is readily adaptable to be constructed as an integrated circuit.

It is a further object of the present invention to provide a radio receiver, the r-f portion of which is entirely or substantially entirely on a single integrated-circuit chip.

Other objects will become apparent in the course of a detailed description of the invention.

A radio receiver from antenna to detector designed to be realized substantially on an integrated-circuit chip comprises a single tunable oscillator and a plurality of mixers. An input signal from an antenna is connected as an input to a first mixer, either directly or following one or more stages of tuned RF amplification and possibly a stage of external filtering. The input signal is mixed in the first mixer with a signal derived from the oscillator. The signal may be taken directly, may be multiplied to a desired level or may be divided to a desired level. A particular output from the first mixer is selected by a first tunable filter. The output of the first tunable filter is taken as an input to a second mixer where it is mixed with a second signal derived from the oscillator. The process of mixing and application of the mixed signal to a tunable filter to select a desired frequency is continued as needed until the signal is reduced to a desired intermediate frequency range where it is amplified as needed to a level sufficient to drive a discriminator. Successive mixers receive, as inputs, signals that are derived from the oscillator and that are in ratios to each other of integers of the order of two to eight. These successive frequencies are achieved by multiplying the frequency of the oscillator if necessary to achieve an input mixing frequency for the first mixer and any successive mixer inputs that are higher than the frequency of the oscillator, and by successive steps of division of the frequency as needed to achieve lower mixing frequencies. The oscillator may be a crystal-controlled oscillator, in which case tuning to different desired frequencies, may be accomplished by the selection of different crystals. In the alternative, the oscillator may be a frequency synthesizer, in which case a single crystal will suffice as a frequency-controlling element, and the oscillator frequency is obtained by controlled multiplications and divisions of the frequency of the crystal. The center frequency of each of the tunable filters changes as different crystals or synthesized base frequencies are selected. This variation continues through the last intermediate frequency.

BRIEF DESCRIPTION OF THE DRAWINGS

FIG. 1 is a functional block diagram of an embodiment of the present invention using a crystal controlled oscillator.

FIG. 2 is an alternate embodiment of the present invention using a voltage-controlled oscillator.

FIG. 3 is a circuit realization of a typical tunable filter as used in FIGS. 1 and 2.

DETAILED DESCRIPTION OF THE INVENTION

Figure 4:
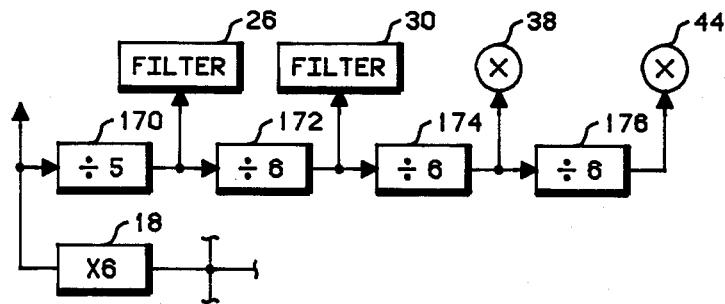
FIG. 4 is a block diagram of a circuit for developing control frequencies for the circuit of FIG. 1.

FIG. 1 is a block diagram of an embodiment of the the present invention. In FIG. 1, an antenna 10 receives a signal that is amplified in RF amplifier 12 and applied as one input to a mixer 14. In the alternative, if the level of the signal received at antenna 10 were sufficiently high, it would be possible to connect antenna 10 directly to mixer 14. In either case, mixer 14 receives as a second input a signal that is generated in oscillator 16 and multiplied to desired frequency in multiplier 18. Oscillator 16 is controlled in frequency by the selected one of three crystals 20, 22 and 24. Only three such crystals are shown here, but it is evident that a number of crystals might be selected that was equal to the number of channels assigned to the user of a radio system.

The output of mixer 14 contains components of the inputs, their sum and their difference. The difference frequency is selected in filter 26 and applied as one input to mixer 28 where it is mixed with the output of oscillator 16. The difference between the frequency of the output of filter 26 and the output of oscillator 16 is selected in filter 30 and applied as an input to mixer 32. A signal for application to mixer 32 is obtained by dividing the output of oscillator 16 in divider 34. The processes of mixing, filtering and dividing are continued as needed subject to the following constraints. First, it is desired to reduce the frequency of the signals by mixing to a frequency where adequate adjacent-channel selectivity can be obtained. A typical frequency is of the order of 50 or 60 KHz. Second, it is typically desirable to limit the multiplication ratio of a multiplier such as multiplier 18 and the dividing ratio of a divider such as divider 34 to an integral number between two and eight with four, five and six being particularly useful numbers representing a workable compromise between the required selectivity of filter 30 and the number of mixers that are to be used.

The circuit of FIG. 1 continues with the output of divider 34, further divided in divider 36 and applied to mixer 38 to mix with the difference frequency that is selected by filter 40. Filter 42 selects the difference of the input frequencies to mixer 38 for application to mixer 44. Divider 46 further divides the output of divider 36 for application as a second input to mixer 44. The difference of the input signals to mixer 44 is taken as an input to filter 48, the output of which is amplified in amplifier 50. Divider 52 divides the output of divider 46 to provide a signal at the IF frequency for controlling the location of the passband of filter 48. Amplifier 50 is here shown as one stage, but it is evident that it might equally as well be any required number of stages to achieve a desired level of input to discriminator 54. Also, filter 48 may be a number of cascaded stages to achieve the high degree of selectivity needed to reject adjacent-channel signals. In addition to producing an audio output at terminal 56, discriminator 54 could produces an automatic frequency control signal to control the frequency of oscillator 16, as typically found in many present-day receivers.

FIG. 2 is a block diagram of an alternate embodiment of the present invention. The circuit of FIG. 2 is similar to that of FIG. 1 in that each represents the portion of a radio receiver that begins at an antenna and includes components up to an audio stage. However, FIG. 2 differs from FIG. 1 in that the main source of frequencies for mixing is a voltage-controlled oscillator that is part of a phase-locked loop. FIG. 2 is also designed to operate in the frequency range of 150 to 174 MHz. The particular range of input frequencies for which the circuits of both FIG. 1 and FIG. 2 are designed are themselves incidental to the design, except for the fact that different frequency ranges will require different combinations of division ratios and might conceivably require more or fewer mixers. Referring to FIG. 1, a design consideration there that will also appear in FIG. 2 is the desire to have an input frequency to filter 48 that is in the range of 50 to 70 KHz. This is referred to as the IF frequency. Filter 48 determines adjacent-channel selectivity, so it is desirable to set its mid-frequency around ten times the channel bandwidth to simplify filter design. It is also desirable to have oscillator 16 operate at a frequency that is easy to obtain under the control of crystals 20, 22 and 24. Comparable considerations will become apparent in the circuit of FIG. 2.

In FIG. 2 an antenna 62 receives a signal that is applied to an RF amplifier 64 where it is amplified and taken as an input to mixer 66. In the alternative, if signal levels are sufficiently high, antenna 62 could be coupled directly to mixer 66. A second input to mixer 66 is supplied by voltage-controlled oscillator (VCO) 68. VCO 68 is the fundamental source of mixing frequencies for the circuit of FIG. 2. The output of VCO 68 is divided by 5 in divider 70, and the divided output of divider 70 is divided by 2 in divider 72. The output of divider 72 is taken to a phase detector 74 where it is compared with the output of oscillator 76. The output of phase detector 74 which provides a measure of the difference in phase of the input signals is taken to a low-pass filter 78, the output of which serves as a control signal for VCO 68. The combination of VCO 68, dividers 70 and 72, phase detector 74, and low-pass filter 78 comprises a phase-locked loop which controls the output frequency of VCO 68 with respect to the output of oscillator 76.

The output of mixer 66 is taken to band-pass filter 80 which selects the difference frequency between the inputs to mixer 66. The output of filter 80 is taken as one input to mixer 82. A second input to mixer 82 is the output of divider 70. The output of mixer 82 is taken to band-pass filter 84 which again selects a difference frequency that is applied to mixer 86. The output of divider 72 is applied to divider 88 producing as an output a second input to mixer 86. The difference of the inputs to mixer 86 is selected in band-pass filter 90, and that difference is applied as one input to mixer 92. The output of divider 88 is taken as an input to divider 94, the output of which is taken as a second input to mixer 92. The difference of the inputs to mixer 92 is selected by band-pass filter 96 and taken as an input to mixer 98. The output of divider 94 is also taken as an input to divider 100, the output of which is taken as a second input to mixer 98. The difference frequency of the inputs to mixer 98 is selected in filter 102 which is the principal determiner of selectivity in the circuit. The center frequency of band-pass filter 102 is controlled by a signal that is derived by applying the output of divider 100 to divider 104. The output of band-pass filter 102 is amplified in amplifier 106 and applied to discriminator 108 which produces an audio signal and also an automatic-frequency-control (AFC) signal. The AFC signal is connected to oscillator 76 to control fine adjustments of the frequency of oscillator 76. Oscillator 76 is here shown as having a crystal 110 as a principal element for determining frequency. It should be apparent first that if the circuit of FIG. 2 is to be tuned to different channels, oscillator 76 must be tunable. This can be accomplished in any of a number of well-known ways. First, a number of crystals similar to crystal 110 can be selected to provide different channels as in FIG. 1. In the alternative, the combination of oscillator 76 and crystal 110 can be replaced with a synthesizer.

The tuning process that has just been described with respect to FIG. 1 and FIG. 2 represents in each case a single selection of a reference frequency that will select a desired channel from among the different frequencies incident on the antenna 10 of FIG. 1 and antenna 62 of FIG. 2. If RF amplifiers 12 of FIG. 1 and 64 of FIG. 2 are used, they must either be broad enough in bandwidth to pass an entire band or else they must be tunable as an additional part of a process of selecting a desired frequency. Tunable RF amplifiers are the more common choice. However, it should be evident from an inspection of the circuits of FIGS. 1 and 2 that when each of these circuits is tuned to a different frequency, the center frequency of each of the band-pass filters must be changed. While these band-pass filters are not the primary determiners of adjacent-channel selectivity, they are needed to remove spurs. For this reason, they cannot be designed to pass an entire band without tuning.

Coupling to each of the band-pass filters of FIGS. 2 and 3 is indicated symbolically by a dashed line. The actual circuit embodiment of that coupling will be made apparent later. The need for that variation is made apparent in Tables I and II. Table I is a listing of the multiplication factors of the frequencies at the output of each of a number of the elements of FIG. 1 and a listing of the corresponding frequencies at the band limits of 450 to 470 MHz. The multiplication factors apply to what is referred to here as an IF frequency. This is the input frequency to the amplifier 50 of FIG. 1, which varies from 57.87 KHz to 60.44 KHz. Inspection of Table I shows that the frequency of each of the bandpass filters of FIG. 1 must be tuned when the receiver is tuned. The same is true in Table II which is a plot of multiplication factors and output frequencies of various elements of FIG. 2.

TABLE I

OUTPUT FREQUENCY RANGES AND MULTIPLICATION FACTORS FOR ELEMENTS OF FIG. 1

| ELEMENT | MULTIPLI-CATION FACTOR | LOWER FREQUENCY | UPPER FREQUENCY |
|---|---|---|---|
| AMPLIFIER 12 | 7776 | 450 MHz | 470 MHz |
| MULTIPLIER 18 | 6480 | 375 MHz | 391.7 MHz |
| MIXER 14 | 1296 | 75 MHz | 78.33 MHz |
| OSCILLATOR 16 | 1080 | 62.5 MHz | 65.28 MHz |
| MIXER 28 | 216 | 12.5 MHz | 13.06 MHz |
| DIVIDER 34 | 180 | 10.416 MHz | 10.879 MHz |
| MIXER 32 | 36 | 2.083 MHz | 2.176 MHz |
| DIVIDER 36 | 30 | 1.736 MHz | 1.813 MHz |
| MIXER 38 | 6 | 347 KHz | 363 KHz |
| DIVIDER 46 | 5 | 289 KHz | 302 KHz |
| MIXER 44 | 1 | 57.87 KHz | 60.44 KHz |
| DIVIDER 52 | 1 | 57.87 KHz | 60.44 KHz |

TABLE II

OUTPUT FREQUENCY RANGES AND MULTIPLICATION FACTORS FOR ELEMENTS OF FIG. 2

| ELEMENT | MULTIPLI-CATION FACTOR | LOWER FREQUENCY | UPPER FREQUENCY |
|---|---|---|---|
| AMPLIFIER 64 | 2784 | 150 MHz | 174 MHz |
| VCO 68 | 2400 | 129.3 MHz | 150 MHz |
| MIXER 66 | 384 | 20.69 MHz | 24 MHz |
| DIVIDER 70 | 480 | 25.86 MHz | 30 MHz |
| MIXER 82 | 96 | 5.17 MHz | 6 MHz |
| DIVIDER 72 | 240 | 12.93 MHz | 15 MHz |
| DIVIDER 88 | 120 | 6.466 MHz | 7.5 MHz |
| MIXER 86 | 24 | 1.293 MHz | 1.5 MHz |
| DIVIDER 94 | 30 | 1.616 MHz | 1.875 MHz |
| MIXER 92 | 6 | 323.3 KHz | 375 KHz |
| DIVIDER 100 | 5 | 269.4 KHz | 312.5 KHz |
| MIXER 98 | 1 | 53.88 KHz | 62.5 KHz |
| DIVIDER 104 | 1 | 53.88 KHz | 62.5 KHz |

It should be emphasized that FIGS. 1 and 2 are chosen to emphasize possible circuits for the practice of the invention in two particular bands. Thus, FIG. 1 indicates a selection of various crystals to make channel selections, while FIG. 2 was described as suggesting a phase-locked loop. This is a matter of design choice. Either could equally as well use a frequency synthesizer. FIG. 1 includes a frequency multiplier to achieve the highest desired input mixing frequency, while FIG. 2 obtains that frequency with a VCO in a phase-locked loop. This, too, is a matter of design choice. In FIG. 1 all of the injection frequencies to the mixers are higher than the input signal frequencies. Some of the injection frequencies in FIG. 2 are lower than the input frequencies to the mixers. This is a matter of design choice. The choice of the frequency ranges for FIGS. 1 and 2 is intended to be illustrative. A different choice of frequency ranges might require mixers or fewer mixers. This, too, is readily achieved.

FIG. 3 is a functional block diagram of a typical automatically tunable filter of the type used in FIGS. 1 and 2. It is evident from the discussion of FIGS. 1 and 2 that all of the filters shown in those figures require a certain amount of tuning as each of the receivers is tuned to a different channel. There are many ways of making tunable filters that follow the frequency at the output of each of the mixers in FIGS. 1 and 2. FIG. 3 shows an automatically tunable filter circuit that is particularly well adapted for inclusion in an integrated circuit. In FIG. 3 a terminal 120 receives an AC signal at a center frequency to which the filter is to be tuned. Terminal 120 is connected to a phase comparator 122. The output of phase comparator 122 is a DC voltage that supplies the frequency control for one or more filters. The DC voltage is applied to voltage-controlled oscillator (VCO) 124 in which the output of integrator 126 is taken both as an input to phase comparator 122 and as an additive input to integrator 128. The output of integrator 128 is taken as a subtractive input to integrator 126. The output of integrator 128 is applied through a resistive network 130 and an inverter 132 to a negative input terminal to integrator 128. The output of phase comparator 122 is applied to control the gains of integrators 126 and 128. The combination of VCO 124 and phase comparator 122 with the gain thus controlled represents a phase-locked loop.

Filtering of an input signal is accomplished in active filter 134. There a signal to be filtered is applied at terminal 136 where it is taken as an additive input to integrator 138. Integrator 138 is subjected to unity negative feedback and to negative feedback from integrator 138, and it supplies an output that is taken as an additive input to integrator 140. The output of integrator 140 is taken as a subtractive input to integrator 138 and also as an additive input to integrator 142, the output of which is taken as a subtractive input to integrator 140. Integrator 141 integrates the output of integrator 140 as a negative feedback input to integrator 140. The output of integrator 142 is taken as an additive input to integrator 144, the output of which is taken both as a subtractive input to integrator 142 and also as the filtered output to terminal 148. Integrator 143 integrates the output of integrator 142 as a negative feedback input to integrator 142, and integrator 145 supplies an integrated negative feedback to the input of integrator 144. The elements of FIG. 3 as connected here represent a four-pole band-pass filter, the center frequency of which can be varied by varying the gain of the integrators. Each back-to-back pair of integrators, such as integrators 138 and 139, represents the equivalent of a filter pole. When the output of phase comparator 122 is taken as indicated to control the gain of each of the integrators 138 through 145, then if those integrators are identical to integrators 126 and 128, it is possible to lock the center frequency of the band-pass filter 134 to the frequency that is applied at terminal 120.

If a source of AC voltage is available at a frequency equal to the desired mid-frequency of the band-pass filter, that source can be used as an input at terminal 120 to control the phase-locked loop and hence set the center frequency of the associated band-pass filter. This is possible with most of the filters of FIGS. 1 and 2 as shown in Table 3 which is a list of sources of frequency control for the filters of FIGS. 1 and 2.

TABLE 3

SOURCES OF FREQUENCY CONTROL FOR FILTERS OF FIGS. 1 AND 2

|  | SOURCE | DIVIDE BY | RESULT | FILTER NO. |
|---|---|---|---|---|
| FIG. 1 | 6480 × IF | 5 | 1296 | 26 |
|  | 1296 × IF | 6 | 216 | 30 |
|  | 216 × IF | 6 | 36 | 38 |
|  | 36 × IF | 6 | 6 | 44 |
| FIG. 2 | — | — | 384 | 80 |
|  | 480 × IF | 5 | 96 | 84 |
|  | 96 × IF | 4 | 24 | 90 |
|  | 24 × IF | 4 | 6 | 96 |

Referring first to the listing for FIG. 1, recall that the output of multiplier 18 produced a multiplication factor of 6480 times the final IF frequency. In the alternative, the IF frequency is 1/6480 of the frequency of the output of multiplier 18. That multiplier is the source of all of the frequencies to be applied to the filters of FIG. 1 because they can be obtained by successive division as indicated in the column "DIVIDE BY." Thus, the result of dividing the source at 6480 times the intermediate frequency by 5 is a value of 1296 times the intermediate frequency. This is the desired control frequency for filter 26. Other listings in Table 3 under the entries for FIG. 1 show that successive divisions by the integers shown produce all of the desired control frequencies for the filters of FIG. 1, except that for filter 48, which is produced by divider 52. The picture is slightly different for FIG. 2. Referring again to Table 3, it can be seen that the desired multiplier for filter 80 is 384. That multiplier is not available by integer division from any of the frequencies in FIG. 2 that are listed in Table 2. For this reason no source is shown for this result in Table 3. An output at 480 times the intermediate frequency is available as the output of divider 70, and this is seen in Table 3 to divide to produce the desired control frequencies for filters 84, 90 and 96. It is generally undesirable to have to multiply frequencies in an integrated circuit because this is accomplished most effectively by the use of reactive elements, in contrast to division, which is handled simply by counting. However, rather than achieve a control frequency at 384 times the IF, note that 384 is equal to four times 96. This means that the center frequency of filter 80 is four times the center frequency of filter 84. Such a filter can be achieved and controlled by using the same control voltage that is applied to filter 84, and scaling element values of filter 80 down by a factor of four from those of filter 84. Such a filter is shown in FIG. 3 as filter 149, in which terminal 150 receives an input to be filtered that is taken as an additive input to an integrator 152. The output of integrator 152 is applied to its input with unity negative feedback and is taken as a positive input to integrator 154. Integrator 153 supplies an integrated negative feedback to integrator 152. The output of integrator 154 is subtracted as an input to integrator 152 and is also applied as an additive input to integrator 156. Integrator 155 is connected as a negative-feedback integrator around integrator 154. The output of integrator 156 is taken as a negative input to integrator 154 and as an additive input to integrator 158. Integrator 157 is connected to supply an integrated negative feedback to integrator 156. The output of integrator 158 is taken as a subtractive input to integrator 156, as a unity negative-feedback input, and also as the filtered output at terminal 162. Integrator 159 supplies an integrated negative feedback to integrator 158. The same control voltage that controlled filter 134 is taken on line 164 to control the gain of each of the integrators 152 through 159. When the element values are scaled as described above, then the center frequency of the filter represented by elements 150 through 162 is similarly scaled by a factor of four. Thus, if element values of filter 134 are selected for a center frequency 96 times the IF, scaling these values down by 4. This is a way to achieve band-pass filtering at a frequency of 384 times the IF frequency as required in FIG. 2. It should be evident that such scaling could also have been carried out as desired to reduce the number of phase-locked loops that were necessary to establish control voltages. Thus, in the filters of FIG. 1, it is possible to have five phase-locked loops, each controlling a separate frequency. In the alternative, it is possible to have one, two, three or four phase-locked loops and to scale other filters for control by the voltage from one of the loops as described.

Figure 5:
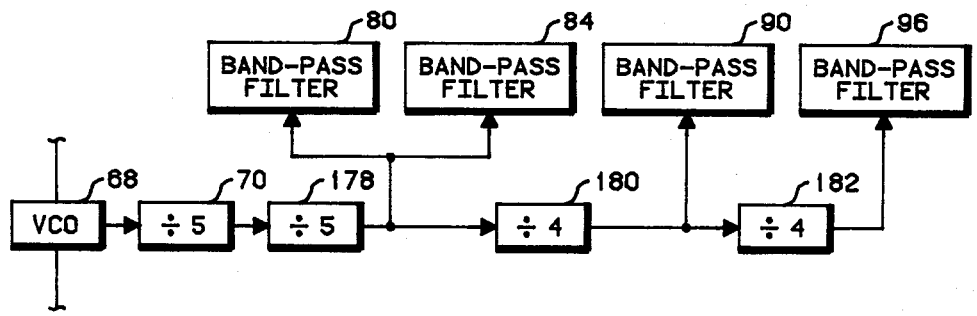
FIG. 5 is a block diagram of a circuit for developing control frequencies for the circuit of FIG. 2.

FIGS. 4 and 5 are block diagrams of possible means for developing appropriate frequency-controlled chains for for developing appropriate frequency-controlled chains for the circuits of FIGS. 1 and 2, respectively. The block diagrams of FIGS. 4 and 5 are shown separately rather than in conjunction with FIGS. 1 and 2 to emphasize the fact that control of the center frequencies of the various tunable filters may be effected in many different ways. The frequency sources of Table 3 are just one particular example of a way of obtaining the control frequencies. The values of Table 3 are obtained by the circuits that are indicated as block diagrams in FIGS. 4 and 5. In FIG. 4, as indicated in Table 3, the source of control frequencies at 6480 times the IF frequency is the output of multiplier 18 of FIG. 1 which is repeated in FIG. 4. The output signal from multiplier 18 is divided by 5 in divider 170 to produce a control signal at 1296 times the IF frequency for filter 26. The output of divider 70 is divided by 6 in divider 172 to produce a control frequency at 216 times the IF frequency to control filter 30. The output of divider 172 is again divided by 6 in divider 174 to produce a control signal at 36 times the IF frequency to control the center frequency of filter 38. The output of divider 174 is divided by 6 in divider 176 to produce a control signal at 6 times the IF frequency to control the center frequency of filter 44. Referring to FIG. 1, it can be seen that no further division is necessary since the succession of frequencies produced by dividers 34, 36, 46 and 52 has already produced a control frequency for filter 48. It should be emphasized that the dividers of FIG. 4 represent just one of many ways of achieving the control frequencies that are necessary for filters 26, 30, 38 and 44.

FIG. 5 is a block diagram of a circuit for achieving the control frequencies for the filters of FIG. 2. In FIG. 5 VCO 68 and divider 70 are reproduced from FIG. 2 to show the source of a signal at 480 times the IF frequency. This signal is divided by 5 in divider 178 to produce a control signal at 96 times the IF frequency to control both filter 84 and its scaled counterpart, filter 80, as discussed above. The output of divider 178 is taken to divider 180 where it is divided by 4 to produce a signal at 24 times the IF frequency to control filter 90. The output of divider 180 is again divided by 4 in divider 182 to produce a control signal at 6 times the IF frequency to control filter 96. As with the block diagram of FIG. 4, it is unnecessary to divide further because there is a signal at the IF frequency that is produced by divider 104 of FIG. 2 that controls the center frequency of filter 102.

I claim:

1. A method of converting a received radio signal at an antenna to an intermediate-frequency signal, the method comprising the steps of:

generating a first local-oscillator signal;

mixing the first local-oscillator signal with the received radio signal to produce a first sum of and difference between the first local-oscillator signal and the received radio signal;

deriving a first filter control signal from said first local oscillator signal for tuning a first automatically tunable filter to a center frequency approximately equal to one of said first sum of and difference between the first local oscillator signal and the received radio signal;

selecting one of the sum and the difference between the first local-oscillator signal and the received radio signal in said first automatically tunable filter;

dividing the first local-oscillator signal by an integer between two and eight to produce a second local-oscillator signal;

mixing the second local-oscillator signal with the selected one of the sum and the difference between the first local-oscillator signal and the received radio signal to produce a sum of and a difference between the second local-oscillator and the selected one of the sum and difference;

deriving a second filter control signal from said second local oscillator signal for tuning a second automatically tunable filter to a center frequency approximately equal to one of said first sum of and difference between the second local oscillator signal and the signal selected by said first automatically tunable filter; and selecting one of the sum and the difference between the second local-oscillator signal and the selected one of the sum and difference between the first local-oscillator signal and the received radio signal in said second automatically tunable filter to produce an output signal, which output signal is the intermediate-frequency signal.

2. The method of claim 1 comprising in addition the steps of repeating the steps of dividing, mixing and selecting in a filter until a selected one of a sum and a difference is at a frequency that permits adequate adjacent channel selectivity.

3. The method of claim 2 wherein the frequency is less than 70 kilohertz.

4. The method of claim 2 comprising in addition the steps of:

dividing the first-control signal successively by each of a plurality of integers, each of said integers having a value between two and eight, to produce a successive control signal for each successive automatically tunable filter;

applying each successive control signal to each successive automatically tunable filter to control a frequency range of the successive automatically tunable filter.

5. A circuit for converting a received radio signal at an antenna to an intermediate frequency, the circuit comprising:

generating means for generating a first local-oscillator signal;

first mixing means connected to the antenna and to the means for generating a first local-oscillator signal to mix the first local-oscillator signal with the received radio signal to produce first sum and difference frequencies;

first automatically tunable selecting means connected to the first mixing means and responsive to said generating means for selecting one of the first sum and difference frequencies, said first selecting means having a center frequency set equal to said one of the first sum and difference frequencies exclusively by said generating means;

first means for dividing the frequency of the first local-oscillator signal by an integer between two and eight to produce a signal local-oscillator signal;

second mixing means connected to the first automatically tunable selecting means and to the first means for dividing, the second mixing means mixing the second local-oscillator and a selected one of the first sum and difference frequencies to produce second sum and difference frequencies; and second automatically tunable selecting means connected to the second mixing means and responsive to said first dividing means for selecting one of the second sum and difference frequencies, said second selecting means having a center frequency set equal to said one of the second sum and difference frequencies exclusively by said first dividing means;

which selected one is the imtermediate frequency.

6. The circuit of claim 5 wherein the means for generating a first local-oscillator signal is tunable to select a desired broadcast channel.

7. The circuit of claim 5 comprising in addition:

second means for dividing the frequency of the second local-oscillator signal by an integer between two and eight to produce a third local-oscillator signal;

third mixing means connected to the second means for dividing and to the second selecting means, the third mixing means mixing the third local-oscillator signal and an output signal from the second selecting means to produce a third sum and difference frequecny; and third automatically tunable selecting means connected to the third mixing means and responsive to said second dividing means for selecting one of the third sum and difference frequencies, said third selecting means having a center frequency set equal to said one of the third sum and difference frequencies by said second dividing means;

which selected one is an intermediate frequency.

8. The circuit of claim 7 comprising in addition:

third means for dividing the frequency of the third local-oscillator signal by an integer between two and eight to produce a fourth local-oscillator signal;

fourth mixing means connected to the third means and to the third selecting means, the fourth mixing means mixing the fourth local-oscillator signal and an output signal from the third selecting means to produce a fourth sum and difference frequency; and forth automatically tunable selecting means connected to the fourth mixing means and responsive to said third dividing means for selecting on the fourth sum and difference frequencies, said fourth selecting means having a center frequency set equal to said one of the fourth sum and difference frequencies by said third dividing means;

fourth means for dividing the frequency of the fourth local-oscillator signal by an integer between two and eight to produce a fifth local-oscillator signal;

fifth mixing means connected to the fourth means for dividing and to the fourth selecting means, the fifth mixing means mixing the fifth oscillator signal and an output signal from the fourth selecting means to produce a fifth sum and difference frequency; and fifth automatically tunable selecting means connected to the fifth mixing means and responsive to said fourth dividing means for selecting on of the fifth sum and difference frequency, said fifth selecting means having a center frequency set equal to said one of the fifth sum and difference frequencies by said fourth dividing means;

which selected one is an intermediate frequency.

9. A circuit for converting a received signal at an antenna to an intermediate frequency, the circuit comprising:

a local oscillator (16) producing a local-oscillator signal;

a multiplier (18) connected to the local-oscillator to produce a multiplied local-oscillator signal;

a first mixer (14) connected to the antenna and to the multiplier to produce a sum and a difference frequency between the received signal and the multiplied local-oscillator signal;

a first tunable filter (26) connected to the first mixer to select one of the sum and difference frequencies;

a second mixer (28) connected to the local-oscillator and to the first tunable filter to produce a sum and a difference frequency between an output signal from the first tunable filter and an output signal from the local-oscillator;

a second tunable filter (30) connected to the second mixer to select one of the sum and difference frequencies from the second mixer;

a first divider (34) connected to the local-oscillator to produce and output signal at a frequency equal to the frequency of the output signal from the local-oscillator divided by an integer between two and eight;

a third mixer (32) connected to the second tunable filter and to the first divider to produce a sum and a difference frequency between an output signal from the second tunable filter and an output signal from the first divider;

a third tunable filter (40) connected to the third mixer to select one of the sum and difference frequencies from the third mixer;

a second divider (36) connected to the first divider to produce an output signal at a frequency equal to the frequency of the output signal from the first divider, divided by an integer between two and eight;

a fourth mixer (38) connected to the third tunable filter and to the second divider to produce a sum and a difference frequency between an output signal from the second tunable filter and the output signal from the second divider;

a fourth tunable filter (42) connected to the fourth mixer to select one of the sum and difference frequencies from the fourth mixer;

a third divider (46) connected to the second divider to produce an output signal at a frequency equal to the frequency of the output signal from the second divider, divided by an integer between two and eight;

a fifth mixer (44) connected to the fourth tunable filter and to the third divider to produce a sum and a difference frequency between an output from the fourth tunable filter and the output signal from the third divider;

a fifth tunable filter (48) connected to the fifth mixer to select one of the sum and difference frequencies from the fifth mixer;

a fourth divider connected to the third divider and to the fifth tunable filter to produce a signal at a frequency equal to the frequency of the third divider, divided by an integer between two and eight, and to control a center frequency of the fifth tunable signal at the frequency of the signal produced by the fourth divider; and means connected to the first, second, third, fourth and fifth tunable filters for tuning the center frequencies of the filters as an exclusive function of frequency of the local-oscillator signal.

10. The circuit of claim 9 wherein the local-oscillator (16) comprises a tunable local oscillator (16, 20, 22, 24).

11. The circuit of claim 9 wherein the center frequency of the fifth tunable signal is less than 70 kilohertz.

12. A circuit for converting an input signal to an intermediate frequency, comprising:

frequency generator means for generating signals at any of a plurality of integer related frequencies;

a mixer for receiving said input signal and mixing said input signal with a first one of said generated signals to produce said intermediate frequency signal; and a tunable filter, having an external frequency input responsive to a second one of said generated signals to control the center frequency of said tunable filter, said external frequency input being coupled to said frequency generator means, said tunable filter coupled to said mixer for passing said intermediate frequency signal while attenuating undesired frequencies, whereby the center frequency of said tunable filter is exclusively determined by said frequency generating means and is set equal to said intermediate frequency.

13. The circuit of claim 12, further including:

a second mixer for receiving said intermediate frequency and mixing said intermediate frequency with a third one of said generated frequencies to produce a second intermediate frequency; and a second tunable filter having an external frequency input responsive to a fourth one of said generated signals to control the center frequency of said second tunable filter, said external frequency input being coupled to said frequency generator means, said second tunable filter coupled to said second mixer for passing said second intermediate frequency while attenuating undesired frequencies, whereby the center frequency of said second tunable filter is exclusively determined by said frequency generating means and is set equal to said second intermediate frequency.

14. The circuit of claim 13, wherein said frequency generator means includes a frequency synthesizer.

15. A circuit for converting an input signal to an intermediate frequency, comprising:
frequency sythesizer means for generating signals at any of a plurality of generated frequencies, said frequency synthesizer means including a reference frequency generator for producing a preferenced frequency, a VCO for producing a VCO frequency and a phase comparator having an error signal output, said error signal output providing an error signal relating the phase of the reference frequency with the phase of the VCO frequency;
a mixer for receiving an input signal and mixing said input signal with one of said plurality of generated frequencies to produce an intermediate frequency signal; and
a tunable filter, operatively coupled to said error signal output of said phase comparator and responsive thereto so that the center frequency of said tunable filter is determined exclusively by said phase comparator error signal output and set equal to said intermediate frequency, said tunable filter coupled to said mixer for passing said intermediate frequency signal while attenuating undesired frequencies;
whereby, said tunable filter automatically adjusts to changes in said generated frequencies so that proper filtering of said intermediate frequency signal is maintained.

16. A superheterodyne receiver system capable of receiving signals on a plurality of frequency channels within a particular band, comprising:
injection means for generating a first injection signal at a first injection frequency;
first mixing means, having an input for accepting signals at a desired input frequency, an injection input coupled to said injection means for receiving said injection signal, and an output for providing a signal at a first intermediate frequency, wherein said first injection frequency and said desired input frequency are both integer multiples of said first intermediate frequency for any and all of said channels in said frequency band; tunable filtering means, coupled to said output of said first mixing means, for filtering said first intermediate frequency signal; and filter control means, responsive to said injection means, coupled to said tunable filter means, for controlling the center frequency of said tunable filtering means so that said center frequency is set equal to said first intermediate frequency and said first intermediate frequency signal is appropriately filtered for any and all channels in said frequency band.

17. The superheterodyne receiver system of claim 16, wherein said integer multiples include integers having values between two and eight.

18. The superheterodyne system of claim 16 wherein; said system includes a second mixing means, having an input for accepting signals from said output of said filtering means, an injection input, an output for providing a signal at a second intermediate frequency.

19. The superheterodyne system of claim 18, wherein said injection means further includes second injection signal means for generating a second injection signal at a second injection frequency, said second injection signal means connected to said injection input of said second mixing means.

20. The superheterodyne system of claim 19, wherein said input frequency to said first mixing means, said first and second intermediate frequencies, and said first and second injection frequencies are an integer multiple of said second intermediate frequency for any and all of the channels within said frequency band.

21. The superheterodyne system of claim 20, further including an integrated circuit, wherein said first and second mixing means, said injection means, said tunable filter, and said control means substantially reside in said integrated circuit.

22. The superheterodyne system of claim 20, wherein said tunable filtering means has appropriate characteristics to provide protection against image frequency spurious response.

23. The superheterodyne system of claim 16, further including an integrated circuit and wherein said first mixing means and said injection means substantially resides in said integrated circuit.

24. The superheterodyne system of claim 16, wherein said tunable filtering means has appropriate characteristics to provide adequate adjacent channel selectivity.

* * * * *